(12) United States Patent
Ziegler

(10) Patent No.: US 11,469,357 B2
(45) Date of Patent: Oct. 11, 2022

(54) REFLECTIVE COMPOSITE MATERIAL, IN PARTICULAR FOR SURFACE-MOUNTED DEVICES (SMD), AND LIGHT-EMITTING DEVICE WITH A COMPOSITE MATERIAL OF THIS TYPE

(71) Applicant: Alanod GmbH & Co. KG, Ennepetal (DE)

(72) Inventor: Stefan Ziegler, Sprockhövel (DE)

(73) Assignee: Alanod GmbH & Co. KG, Ennepetal (DE)

( * ) Notice: Subject to any disclaimer, the term of this patent is extended or adjusted under 35 U.S.C. 154(b) by 84 days.

(21) Appl. No.: 16/629,814

(22) PCT Filed: Jun. 12, 2018

(86) PCT No.: PCT/EP2018/065516
§ 371 (c)(1),
(2) Date: Jan. 9, 2020

(87) PCT Pub. No.: WO2019/011554
PCT Pub. Date: Jan. 17, 2019

(65) Prior Publication Data
US 2020/0194641 A1  Jun. 18, 2020
US 2021/0167262 A9  Jun. 3, 2021

(30) Foreign Application Priority Data
Jul. 13, 2017  (DE) .......................... 10 2017 115 798
Oct. 12, 2017  (EP) ..................................... 17196142

(51) Int. Cl.
*H01L 33/60* (2010.01)
*H01L 33/62* (2010.01)
*H01L 33/48* (2010.01)

(52) U.S. Cl.
CPC ............ *H01L 33/60* (2013.01); *H01L 33/486* (2013.01); *H01L 33/62* (2013.01)

(58) Field of Classification Search
CPC ................................ H01L 33/60; H01L 33/62
See application file for complete search history.

(56) References Cited

U.S. PATENT DOCUMENTS 6,407,411 B1    6/2002  Wojnarowski et al.
10,559,731 B1 * 2/2020  Elizondo ................. H01L 33/60
(Continued)

FOREIGN PATENT DOCUMENTS

CN       203277501 U    11/2013
DE        29812559 U1   11/1999
(Continued)

OTHER PUBLICATIONS

Lee, W et al. 2014, 'Porous Anodic Aluminum Oxide: Anodization and Templated Synthesis of Functional Nanostructures', Chemical Reviews, vol. 114, pp. 7487-7556 (Year: 2014).*
(Continued)

*Primary Examiner* — Feifei Yeung Lopez
(74) *Attorney, Agent, or Firm* — Dickinson Wright PLLC

(57) ABSTRACT

A reflective composite material with a carrier consisting of aluminum with, on one side (A) of the carrier, an interlayer made of aluminum oxide, and with, above the interlayer, an optically active reflection-boosting multilayer system. In order to provide a high-reflectivity composite material of this kind which exhibits improved electrical connectivity when surface-mounting procedures are used, it is proposed that the thickness of the interlayer is in the range 5 nm to 200 nm, and that a layer of a metal or a metal alloy has been applied superficially on side (B) of the carrier that is opposite to the optically active reflection-boosting multilayer system, where the electrical resistivity at 25° C. of the
(Continued)

metal or metal alloy is at most $1.2 \times 10^{-1}$ $\Omega mm^2/m$, where the thickness of the layer applied superficially is in the range 10 nm to 5.0 μm.

23 Claims, 3 Drawing Sheets

(56) References Cited

U.S. PATENT DOCUMENTS

| | | | | |
|---|---|---|---|---|
| 2011/0278624 | A1* | 11/2011 | Nam | H01L 33/486 |
| | | | | 257/E33.056 |
| 2013/0070371 | A1* | 3/2013 | Childress | G11B 5/6082 |
| | | | | 360/235.4 |
| 2014/0175495 | A1* | 6/2014 | Chuang | H01L 33/0093 |
| | | | | 257/99 |
| 2014/0284651 | A1 | 9/2014 | Tsuchiya et al. | |
| 2015/0069438 | A1* | 3/2015 | Tong | H04L 27/2602 |
| | | | | 257/98 |
| 2015/0349221 | A1 | 12/2015 | Odnoblyudov | |
| 2015/0349227 | A1* | 12/2015 | Oda | H01L 23/495 |
| | | | | 362/296.02 |
| 2018/0103516 | A1* | 4/2018 | Shun | H01L 33/0095 |
| 2018/0239067 | A1* | 8/2018 | Templin | B32B 27/00 |
| 2018/0315908 | A1* | 11/2018 | Lee | H01L 33/62 |
| 2020/0013924 | A1* | 1/2020 | Kamiyama | H01L 33/10 |

FOREIGN PATENT DOCUMENTS

| | | | |
|---|---|---|---|
| DE | 10340005 | A1 | 3/2004 |
| DE | 202011050976 | U1 | 11/2012 |
| DE | 102012108719 | A1 | 3/2014 |
| DE | 102015114095 | A1 | 3/2017 |
| EP | 1876653 | A2 | 1/2008 |
| EP | 2138761 | A1 | 12/2009 |
| EP | 2416389 | A1 | 2/2012 |
| EP | 3196334 | A1 | 7/2017 |
| JP | H8292308 | A | 11/1996 |
| JP | 2009177736 | A | 8/2009 |
| JP | 2011146741 | A | 7/2011 |
| JP | 20130062490 | A | 4/2013 |
| JP | 2013143559 | A | 7/2013 |
| JP | 2015126137 | A | 7/2015 |
| JP | 2015169677 | A | 9/2015 |
| JP | 12015501506 | A1 | 9/2015 |
| JP | 2015201608 | A | 11/2015 |
| WO | 3029784 | A1 | 5/2000 |
| WO | 2017032807 | A2 | 3/2017 |
| WO | 2017032809 | A1 | 3/2017 |
| WO | WO2017078399 | * | 5/2017 |

OTHER PUBLICATIONS

European Patent Office, Rijswijk, Netherlands, International Search Report of International Application No. PCT/EP2018/065516, dated Aug. 6, 2018, 2 pages.

Ho, C. Y et al., "Electrical Resistivity of Ten Selected Binary Alloy Systems," J. Phys. Chem. Ref. Data, vol. 12, No. 2, 1983, pp. 183-322.

* cited by examiner

REFLECTIVE COMPOSITE MATERIAL, IN PARTICULAR FOR SURFACE-MOUNTED DEVICES (SMD), AND LIGHT-EMITTING DEVICE WITH A COMPOSITE MATERIAL OF THIS TYPE

CROSS REFERENCE TO RELATED APPLICATIONS

This application is a 35 U.S.C. § 371 national phase application of International Application No. PCT/EP2018/065516, filed Jun. 12, 2018, which claims the benefit of priority under 35 U.S.C. § 119 to German Patent Application No. 10 2017 115 798.0, filed Jul. 13, 2017, and European Patent Application No. 17196142.8, filed Oct. 12, 2017, the contents of which are incorporated herein by reference in their entirety.

FIELD

The present invention relates to a reflective composite material with a carrier consisting of aluminum with, located on the carrier, an interlayer made of aluminum oxide, and with, applied above the interlayer, an optically active reflection-boosting multilayer system. The expression a "carrier consisting of aluminum" here also includes aluminum alloys.

The present invention further relates to a light-emitting device with a reflective composite material of this type.

BACKGROUND

The statements in this section merely provide background information related to the present disclosure and several definitions for terms used in the present disclosure and may not constitute prior art.

A composite material of the type mentioned by introduction in the title is known by way of example from WO 00/29784 A1. The most important aspect of that application is a protective layer located on the surface of the optically active system. The optically active reflection-boosting multilayer system, in that document also termed the functional coating, comprises a reflective layer, e.g. a layer made of aluminum, silver, copper, gold, chromium, nickel or alloys of these. Between the carrier and the functional coating in that document there can be at least one pretreatment layer arranged as interlayer, which in the case of a carrier made of aluminum by way of example can have been produced via an anodic oxidation of the carrier. In that connection, it is said to be well known that lustrous materials in strip form can be produced by way of example from very high-purity aluminum based on aluminum with purity level 99.8% or higher, e.g. 99.9%, or from AlMg alloys, and that the same also applies to roll surfaces with diffuse or specular light reflection. It is also said to be known that specular reflection can be increased by chemical or electrolytic polishing of the surfaces of such strip materials, and that a protective aluminum oxide layer, for example of thickness 1.5 µm, can then be produced by anodic oxidation. The thickness attained by an oxide layer that forms naturally on aluminum is in contrast only about 0.005 µm.

DE 103 40 005 A1 describes a light-emitting device for emitting white light, comprising an electrically insulating substrate which has two connection electrodes provided on the upper surface and on the underside of the substrate, but which is not described in any further detail. The known device here comprises a light-emitting diode (LED) configured as chip, placed on the substrate. The cathode of this light-emitting diode is connected via an adhesive to one of the electrodes, and the anode is connected via a bonding wire to the other electrode. A transparent resin covers the LED and the upper surface of the substrate.

The mounting procedure practiced in DE 103 40 005 A1 is characterized by what is termed the surface-mounting of the LED chip, which is also termed "die". This mounting technique is termed surface-mounting technology, "SMT". The other abbreviation likewise used in this context, "SMD" (surface-mounted device), describes the surface-mounted component, which—in contrast to components involved in conventional through-hole mounting (Through-Hole Technology, "THT") using "wired components"—has no wire connections, but instead takes the form of what is known as flat module directly mounted on a printed circuit board by means of in particular solderable connecting areas (in this case in DE 103 40 005 A1 however with an adhesive).

Another term conventionally used for connection-electrode structures of this type is "lead frame", and in this connection reference is made by way of example to U.S. Pat. No. 6,407,411 B1. A point that should be mentioned in this connection is that in the field of SMD LEDs the material conventionally used nowadays for "lead frames" is silvered copper, which however disadvantageously has low resistance to hydrogen sulfide and exhibits reflectivity of the order of magnitude of only about 93%.

The mounting procedure described in DE 103 40 005 A1 moreover uses what is known as "COB technology" (Chip-on-Board Technology), which is also known as bare-chip mounting. This is a technology for the direct mounting of unhoused semiconductor chips on circuit boards to produce electronic modules. The term "COB" is nowadays used for all modules including the bare semiconductor, whereas it originally meant exclusively modules manufactured by what is known as chip-and-wire technology. This application is based on the more recent, broader interpretation, where this includes the chip-and-wire technology provided by DE 103 40 005 A1 for the LED chip.

An important advantage of LED devices is their high luminous efficacy $\eta_v$. Luminous efficacy means the quotient calculated from the light flux $\Phi_v$ emitted by a light source and the power P consumed thereby. The SI unit of luminous efficacy is lumens per watt (lm/W). As the value of luminous efficacy increases, the light flux available to the eye for a given power consumption of the lamp also increases. The luminous efficacy $\eta_v$ of a lamp is composed here of two factors: the radiant efficacy $\eta_e$ of the lamp and the photometric radiant equivalent K of the radiation emitted.

$$\eta_v = \eta_e * K.$$

While the luminous efficacy of a conventional incandescent lamp is 10 to 30 lm/watt, it is advantageously more than twice that value for LED lamps, specifically 60 to 100 lm/watt.

EP 2 138 761 A1 says that reflectors consisting of aluminum, in particular coated reflectors, can be used to achieve comparatively high illumination intensities or luminous efficacies $\eta_v$—i.e. high efficiencies. The total reflectance of a highly reflective carrier used as reflector also leads to high luminous efficacy. The meaning attributed to the expression "highly reflective" here according to the application is the same as that explained in the abovementioned EP 2 138 761 A1. When "highly reflective" materials are mentioned hereinafter, this means materials which according to DIN 5036, Part 3 (issued 11/79) have a total reflectance of at least 85%, preferably at least 90%, particularly preferably at least 95%.

As already mentioned, rolled aluminum of purity at least 99.8% is widely used as carrier material for reflectors with high total reflectance; the interlayer is applied thereto as basis for PVD layers situated thereabove, and as chemical protective layer. This protective interlayer is preferably produced in an electrolytic oxidation process from solution, resulting in a surface with sufficiently low roughness and sufficient hardness and also with freedom from defects; any pores possibly remaining in the aluminum oxide layer here can be very substantially sealed by heat-sealing in the final phase of the procedure. The level of total reflectance here can be influenced by changes of purity and/or roughness, while diffuse reflectance can be influenced by controlled changes of the rolled structure of the aluminum carrier. Introduction of the aluminum carrier material, in particular in the form of a strip, into the bath for anodic oxidation or electrolytic oxidation from solution to produce the interlayer, produces not only the aluminum oxide interlayer on the upper side thereof but also a further aluminum oxide layer with in essence identical structure on the underside thereof.

The optically active multilayer system then subsequently applied above the interlayer can consist by way of example of at least three layers, where the upper layers are dielectric and/or oxidic layers and the undermost layer is a metallic layer which forms a reflective layer. The metallic layer here can by way of example be a highly reflective layer of very-high-purity silver, deposited on the electrolytically oxidized aluminum layer. It is optically dense, and has extremely high total reflectance in the visible region of light. This type of composite material of the type mentioned in the introduction is widely used in the form of MIRO®-Silver aluminum strip with high-quality surface for lighting, daylight systems and decorative applications.

Other known composite materials of the type mentioned above with silver reflective layers are described in DE 10 2015 114 095 A1, and also in WO 2017/032809 A1. Because these have advantageously high total reflectance together with excellent long-term stability, it seems desirable to use these and other such composite materials as carrier material, e.g. as lead frame structures, for surface-mounted devices (SMD), in particular for LED semiconductor chips, in the context of the surface-mounting and chip-on-board technologies described above. DE 10 2015 114 095 A1 and WO 2017/032809 A1 thus address, as preferred application, the placing of LEDs, e.g. in the form of a chip, on the surface of the composite material described. However, it has been found that the known composite materials can lead, in the context of the technologies mentioned, and in particular when chip-and-wire technology is used, to problems in the electrical contacting of the SMDs.

SUMMARY

The object underlying the present invention is to provide a composite material of the type described in the introduction with high reflectivity and preferably also high long-term stability, i.e. with little long-term loss of total light reflectance, which exhibits improved electrical connectivity when surface-mounting procedures are used, in particular when chip-and-wire technology is used.

The said object is achieved according to the invention in that the thickness of the interlayer consisting of aluminum oxide is in the range 5 nm to 200 nm, and that a layer of a metal or of a metal alloy has been applied superficially on that side of the carrier that is opposite to the optically active reflection-boosting multilayer system, where the electrical resistivity at 25° C. of the said metal or metal alloy is at most $1.2 \times 10^{-1}$ $\Omega mm^2/m$, where the thickness of the layer applied superficially is in the range 10 nm to 5.0 µm.

According to the invention, it is thus advantageously possible, in the context of what is known as wire bonding, to achieve problem-free welding of a wire, in particular ultrasound welding of a gold wire, on the front side or upper side of the composite material of the invention in order to establish a connection between the surface of the composite material and an electronic component applied on the composite material by a surface-mounting procedure, and it is also found that the electrical contact resistance on the reverse side or underside of the composite material of the invention is surprisingly negligibly small. It is therefore easily possible to solder this side to a printed circuit board (PCB) or to apply the same by means of a similar coherent bonding process, e.g. with use of an electrically conductive lacquer, or else adhesive.

The selection of the material and the thickness of the layer of a metal or of a metal alloy superficially applied can advantageously be adjusted appropriately from one another in ideal manner by taking into account a wide variety of considerations, for example electrical resistivity value, resistance to temperature change, in particular during soldering, solder compatibility, availability, price, etc.

When the above considerations are taken into account, the layer of a metal or of a metal alloy superficially applied can preferably be a copper layer with thickness in the range 0.1 µm to 5.0 µm or a silver layer with thickness in the range 10 nm to 500 nm·x A light-emitting device of the invention comprises the reflective composite material of the invention, which forms a lead frame for an electronic component, for example a light-emitting diode configured as bare chip (die), where the electronic device lies on and is secured to the upper side on the lead frame and is electrically contacted to the lead frame by means of a separate wire, and where the composite made of the electronic component (in the form of SMD) and of the lead frame has been cohesively bonded on the underside in electrically conductive manner to a printed circuit board (PCB).

The effect here of using the composite material of the invention to replace the conventional frame structure consisting of silver-plated copper is, in particular if there is no silver in the superficially applied layer, to increase corrosion resistance, in particular in relation to hydrogen sulfide, while at the same time always increasing luminous efficacy, which can in particular assume values well above 100 lm/W.

Other advantageous embodiments of the invention are contained in the dependent claims and in the detailed description below.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

In order that the disclosure may be well understood, there will now be described various forms thereof, given by way of example, reference being made to the accompanying drawings, in which.

Figure 1:
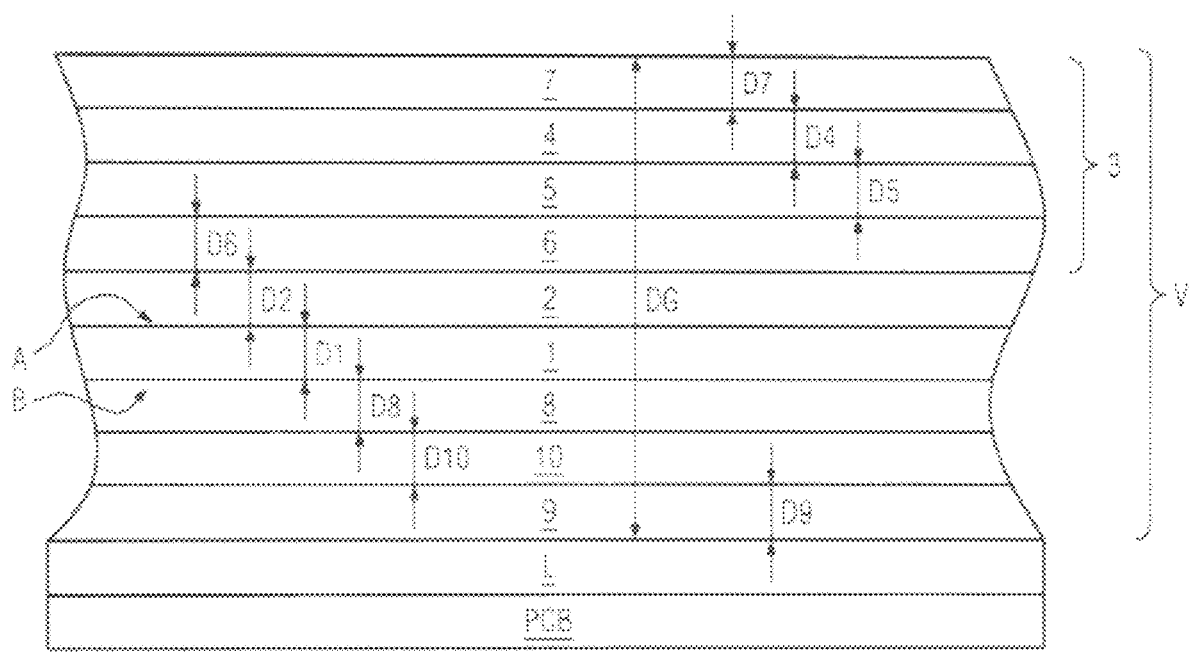
FIG. 1 is an enlarged diagram of a section through an embodiment of a composite material of the invention, where the layer thicknesses are depicted purely diagrammatically and are not to scale.

The drawings are provided herewith for purely illustrative purposes and are not intended to limit the scope of the present invention.

DETAILED DESCRIPTION

The following description is merely exemplary in nature and is in no way intended to limit the present disclosure or its application or uses. It should be understood that throughout the description, corresponding reference numerals indicate like or corresponding parts and features.

In relation to the description that follows, it is expressly emphasized that the invention is neither restricted to the embodiment nor restricted to all of, or a plurality of, features of feature combinations described. Instead, inventive importance can be attached to each individual subfeature of the embodiment, either per se independently of all of the other subfeatures described in connection therewith or in combination with any desired suitable other features.

The same parts also always have the same reference signs in the various figures of the drawing, and the said parts are respectively therefore also generally described only once.

As firstly is apparent from FIG. 1, a reflective composite material V of the invention with a carrier 1 consisting of aluminum has, located on one side A of the carrier 1, an interlayer 2 made of aluminum oxide, and applied on the interlayer 2, an optically active reflection-boosting multilayer system 3. The carrier 1 can be configured as coil with width up to 1600 mm, preferably with width 1250 mm, and with thickness $D_1$ about 0.1 to 1.5 mm, preferably about 0.2 to 0.8 mm. Because all of the thin layers located on the carrier, in particular the interlayer 2 and the layers of the optically active multilayer system 3, are negligibly small in comparison with the carrier, the thickness $D_1$ of the carrier is also the main factor determining the total thickness DG of the composite material V of the invention.

The purity of the aluminum of the carrier 1 can in particular be above 99.0%, thus favourably influencing its thermal conductivity. This enables avoidance of thermal peaks. However, by way of example, it is also possible that the carrier 1 is an Al 98.3 aluminum sheet in strip form, i.e. with purity 98.3 percent. It is also possible to use aluminum alloys as carrier 1, an example being an AlMg alloy, in so far as the interlayer 2 can be formed therefrom by anodic oxidation.

The optically active multilayer system 3 can by way of example—as depicted—consist of at least three layers, where two upper layers 4, 5 thereof are dielectric and/or oxidic layers and the undermost layer 6 situated thereunder is a metallic layer forming a reflective layer 6 and consisting by way of example of aluminum or silver.

In the case depicted, an optionally present protective non-metallic outer layer 7 is additionally depicted, consisting of a low-absorption material, for example silicon dioxide. This type of layer structure is known from the German Utility Model DE 2 98 12 559 U1, the entire content of which is incorporated herein by way of reference in this connection. The respective thickness $D_4$, $D_5$ of the dielectric and/or oxidic layers 4, 5 of the optical multilayer system 3 can by way of example be in the range 30 nm to 200 nm, where this thickness $D_4$, $D_5$ is respectively preferably a quarter of the average wavelength of the spectral range of the electromagnetic radiation to be reflected, in order that the layers 4, 5 can act as reflection-increasing interference layers. The thickness $D_7$ of the protective layer 7 can be in the range 0.5 nm to 20 nm, preferably in the range 0.5 nm to 10 nm. There can also be a protective layer comprising silicon nitride applied as outer layer 7 to the optical multilayer system 3.

The optical multilayer system 3—inclusive of the outer layer 7—and advantageously also the layer 9, described below, of a metal or of a metal alloy, in particular configured as copper layer, can be applied in technologically advantageous manner by use of a continuous vacuum coating process. In particular, the layers 4, 5, 6, 7, 9 here can be sputter layers, in particular layers produced by reactive sputtering, CVD layers or PECVD layers, or layers produced by evaporation, in particular by electron bombardment or from thermal sources.

The reflective layer 6 can optionally be attached to the interlayer 2 by way of an adhesion-promoter layer not depicted, for example consisting of aluminum oxide, titanium oxide and/or chromium oxide. The reflective layer 6 can moreover optionally have been embedded, on the upper side and underside, between barrier layers not depicted, e.g. made of nickel, nickel alloys or palladium, in order to increase resistance to temperature change.

The upper dielectric and/or oxidic layer 4 of the optical multilayer system 3 is a layer with higher refractive index than the lower dielectric and/or oxidic layer 5 of the optical multilayer system 3; the upper layer 4 here can preferably consist of $TiO_2$, $Ta_2O_5$, $Nb_2O_5$, $MoO_3$ and/or $ZrO_2$, and the lower layer 5 here can preferably consist of $Al_2O_3$ and/or $SiO_2$.

Figure 2:
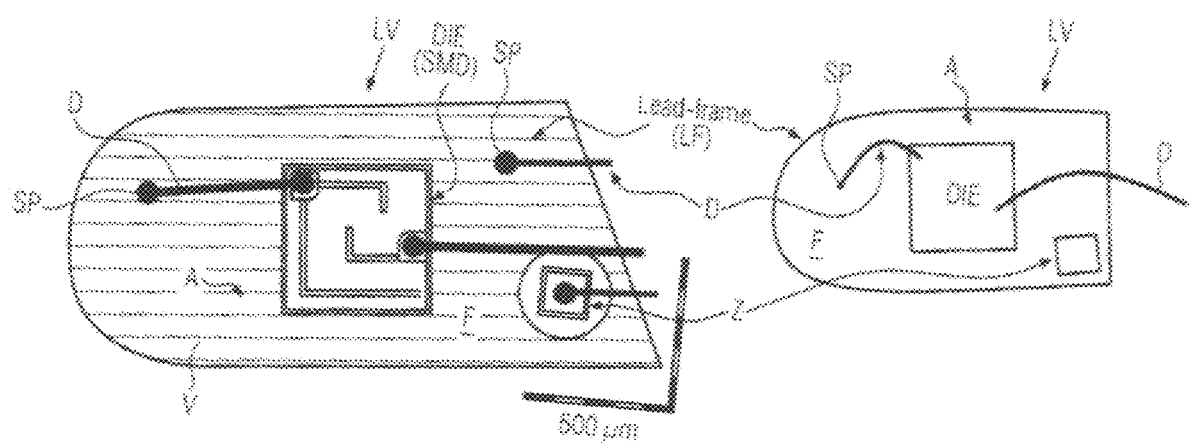
FIG. 2 is a plan view of a subregion of an embodiment of a light-emitting device of the invention.

The invention provides that the thickness $D_2$ of the interlayer 2 consisting of aluminum oxide, in particular composed of anodically oxidized aluminum, is in the range 5 nm to 200 nm, preferably in the range 10 to 100 nm. As already stated, in the context of what is known as wire bonding this advantageously permits according to the invention—as depicted in FIG. 2—firstly welding of a wire D, in particular ultrasound welding of a gold wire, on the front or upper side A of the composite material V of the invention, thus permitting problem-free electrical connection (weld point SP) between the surface A of the composite material V and an electronic component SMD applied by a surface-mounting procedure on the composite material V.

It is preferable here that the arithmetic average roughness value $R_a$ of the surface of the interlayer 2 is below 0.05 μm, in particular below 0.01 μm, particularly preferably below 0.005 μm. This serves, together with the abovementioned high total light reflectance, to establish minimal diffuse light reflectance determined in accordance with DIN 5036. If higher diffuse light reflectance is required, the roughness can be increased accordingly.

Located on that side B of the carrier 1 that is opposite to the optically active reflection-boosting multilayer system 3 there is optionally a further layer 8 which consists of aluminum oxide and which by way of example can be produced simultaneously by the production process during the electrolytic oxidation of the upper side A. However, formation thereof can be avoided if necessary by covering of the side B. There are also known processes for optional removal of such layers. If the further layer 8 which consists of aluminum oxide is present, its thickness D8 should be in the same region as the thickness $D_2$ of the interlayer 2, i.e. in the range 5 nm to 200 nm, preferably in the range 10 to 100 nm.

Another feature essential to the invention is that a layer 9 of a metal or of a metal alloy has been applied superficially on that side B of the carrier 1 that is opposite to the optically active reflection-boosting multilayer system 3, where the electrical resistivity at 25° C. of the said metal or metal alloy is at most $1.2 \times 10^{-1}$ $\Omega mm^2/m$, where the thickness $D_9$ of the layer 9 applied superficially is in the range 10 nm to 5.0 μm.

The said layer can in particular be a copper layer applied with thickness $D_9$ in the range 0.1 μm to 5.0 μm, preferably in the range 0.2 μm to 3.0 μm, particularly preferably in the range 0.5 μm to 1.5 μm.

Another preferred embodiment of the invention provides that the layer 9 superficially applied is a silver layer with thickness $D_9$ in the range 10 nm to 500 nm, in particular with thickness $D_9$ in the range 50 nm to 250 nm.

The maximal value of the electrical resistivity at 25° C. of the layer 9 of a metal or of a metal alloy superficially applied can preferably be $2.7 \times 10^{-2}$ $\Omega mm^2/m$, particularly preferably $1.8 \times 10^{-2}$ $\Omega mm^2/m$.

In respect of the values of electrical resistivity underlying various materials here, reference is made to Table 1 below, which has been collated on the basis of values mentioned at various points in the literature.

TABLE 1

Values of electrical resistivity ρ at 25° C.

| MATERIAL | ρ in $10^{-2}$ $\Omega$ $mm^2/m$ |
|---|---|
| ρ ≤ 1.8 × $10^{-2}$ $\Omega$ $mm^2/m$ particularly preferred according to the invention | |
| Ag | 1.59 |
| Cu | 1.69-1.72 |
| ρ ≤ 2.7 × $10^{-2}$ $\Omega$ $mm^2/m$ preferred according to the invention | |
| Al | 2.65 |
| Au | 2.21 |
| ρ ≤ 1.2 × $10^{-1}$ $\Omega$ $mm^2/m$ according to the invention | |
| W | 5.3 |
| Ni | 6.9-7.1 |
| Pt | 10.5 |
| Pd | 10.7 |
| Sn | 10.9 |

An overview of electrical resistivity p of ten different binary alloys (Al/Cu, Al/Mg, Cu/Au, Cu/Ni, Cu/Pd, Cu/Zn, Au/Pd, Au/Ag, Fe/Ni, Ag/Pd) with respectively different compositions can be found by way of example in the scientific paper "Electrical resistivity of ten selected binary alloys systems", Author: Ho, C. Y. et al., in J. Phys. Chem. Ref. Data, Vol. 12, No. 2, 1983, pp. 183 to 322. Reference can be made to these values when establishing a particular chemical composition in the layer 9 provided according to the invention.

However, another possibility is direct measurement in accordance with ASTM F390-11 "Standard Test Method for Sheet Resistance of Thin Metallic Films With a Collinear Four-Probe Array". This standard also contains instructions for conversion of a sheet resistance determined in the unit Ω or "Ω square" to an electrical resistivity by taking into account the geometry of the layer, i.e. its length, width and thickness.

Between the carrier 1 consisting of aluminum, or the further optionally present layer 8 consisting of aluminum oxide, and the copper layer 9, in a preferred configuration there can be an adhesion-promoter layer 10 which consists by way of example of a transition metal, in particular of titanium, chromium or nickel, with thickness $D_{10}$ that can preferably be in the range 5 nm to 25 nm, particularly preferably in the range 10 nm to 20 nm.

As likewise already mentioned, this advantageously has the result that the electrical contact resistance on the reverse side or underside B of the composite material V of the invention is negligibly small. This side B can therefore be soldered onto a printed circuit board PCB, or applied thereto by means of a similar coherent bonding process. The reference sign L is used in each of FIGS. 1 and 4 to indicate the coherent bonding layer. Soldering can advantageously be achieved by way of example by using tin-containing standard electrical solders, e.g. $Sn_{96.5}Ag_3Cu_{0.5}$.

Despite a relatively thin surface layer 9 of the metal or of the metal alloy, in particular of a copper layer, there has been found to be no formation, between the composite material V of the invention and the solder, of intermetallic phases which are relatively thick in relation to the layer thickness $D_9$, and brittle, and could lead to mechanical—and consequently also electrical—failure of the soldered joint due to thermal stresses: storage under hot conditions for up to 1000 h leads only to formation of an intermetallic phase with thickness of a few 100 nm. It was also found that the soldered bond of the bonding layer L advantageously passed typical tests, in that a peel force or shear force required to separate the connected components LF and COB decreased only by a factor of less than 2 after storage under hot conditions, e.g. at 120° C. for 1000 h.

There can optionally be a passivating layer, not depicted, on the layer 9 of a metal or of a metal alloy superficially applied, and in particular on the copper layer. This can preferably consist of Ag, Ni, Pd and/or Au (Ag/Ni/Pd/Au), its typical thickness possibly being in the range 10 nm to 500 nm, preferably in the range 50 nm to 250 nm. A layer of this type moreover improves the solderability of the finished SMD component on the PCB, because the solder can achieve better wetting of the noble-metal surface.

Figure 3:
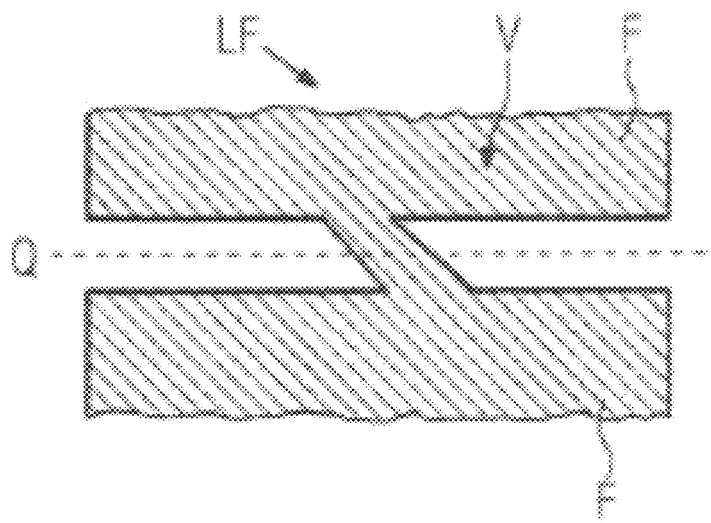
FIG. 3 is a plan view of an embodiment of a lead frame composed of a composite material of the invention for a light-emitting device of the invention.
Figure 4:
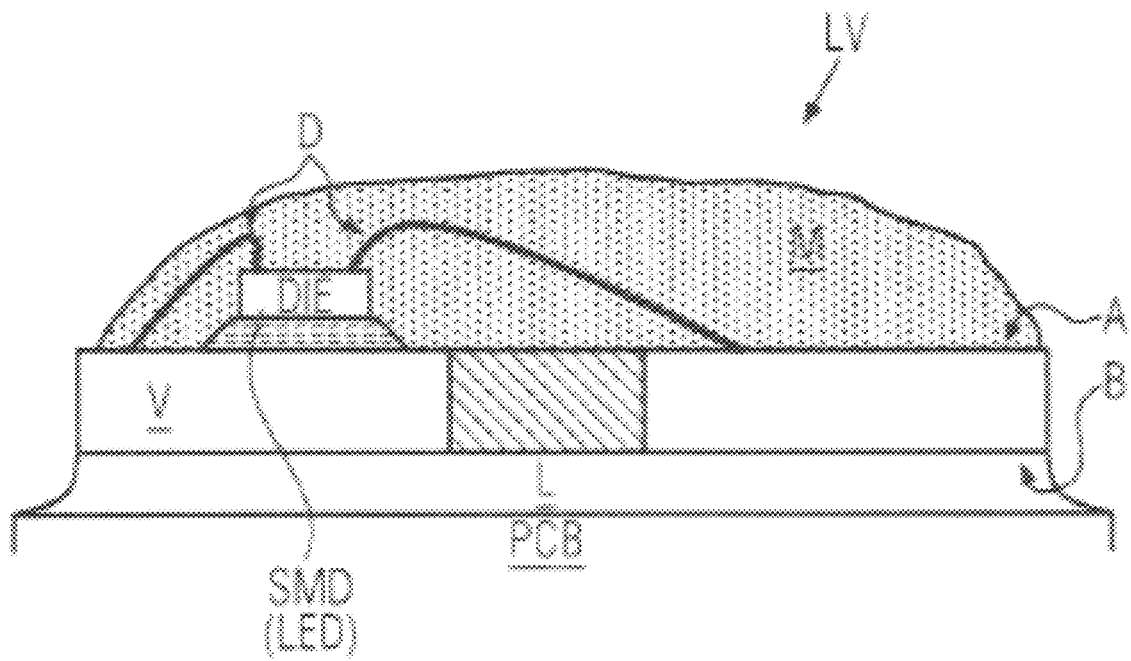
FIG. 4 is a cross section through an embodiment of a light-emitting device of the invention.

A light-emitting device LV of the invention—see in this connection FIGS. 2 and 4—comprises the reflective composite material V of the invention, which can form a lead frame LF for the electronic SMD component, for example a light-emitting diode configured as bare-chip DIE. FIG. 3 depicts this type of lead frame LF. In the form depicted, it has the shape of an H in plan view, where the crossbar Q thereof between the tracks termed fingers F does not run at right angles but instead—as depicted—frequently runs obliquely. This type of lead frame LF can be produced in technologically advantageous manner by way of example by a die-cutting process or by laser cutting. Another possible configuration, if required, is as product of a bending process, because problem-free bending of the composite material V is possible without loss of quality.

It is possible here to begin by combining a large number of lead frames LF in a frame device in the form of a circuit board in strip form in which the lead frames LF are incorporated in fields, i.e. in the form of line elements and of column elements, by way of connectors. The lead frames LF can easily be removed from the frame device, for example broken away or die-cut, thus permitting advantageously easy automated mass production in particular of light-emitting devices LV of the invention. There can be electronic chips SMD provided here to the upper sides of the lead frames LF.

The electronic SMD/DIE component lies on the upper side in the light-emitting device LV of the invention, i.e. on the side A of the lead frame LF, and has been electrically contacted with the lead frame LF by means of at least one separate wire D. FIG. 2 additionally depicts, alongside the LED-die (reference symbol: DIE), a Zener diode Z as further surface-mounted electronic SMD component at the bottom right-hand side. The composite made of the electronic SMD component—or in the case depicted of the two electronic SMD (DIE and Z) components depicted—and of the lead frame LF has been coherently bonded in electrically conductive manner on the underside (side B) to a printed circuit board PCB.

On the carrier 1 there can also be—in a modification of the embodiment depicted—other reflection-boosting systems 3 with other layers. In this connection, particular mention may be made of the system of DE 10 2015 114 095 A1 with the reflection-boosting silver layer, in so far as it is designed according to the invention. In contrast, the system described in WO 2017/032809 A1 necessarily provides, in the interlayer 2, the presence of an organic layer-forming lacquer with thickness up to 5 μm; this situation should be avoided according to the invention. The wording "interlayer 2 made of aluminum oxide" should preferably be regarded according to the application as having the narrow meaning "exclusively consisting of", but according to the application the optional existence of sublayers in the interlayer 2 cannot be entirely excluded. However, in every case the thickness $D_2$ of the entire interlayer 2 should then be in the range 5 nm to 200 nm.

Although the optical multilayer system 3 can have more than the layers 4, 5, 6 described above, it is not permissible according to the invention to apply thereon, as outer layer 7, an organic or organosilicon lacquer layer, e.g. based on a sol-gel layer of the type likewise described in the prior art.

The person skilled in the art can, within the scope of the claims, provide other advantageous embodiments of the invention without departing from the scope of the invention. By way of example, in FIG. 4 the surface of the light-emitting device LV of the invention has been potted with a transparent composition M, e.g. with an epoxy resin. Alternatively or additionally, there could also be optical lens systems provided above the electronic SMD component configured as LED chip DIE.

In so far as a silver layer is mentioned above, in particular as reflective layer 6, this includes the possibility that the said layer comprises alloy elements in the range 0.001 percent by mass to 5.0 percent by mass, in particular in the range 0.5 percent by mass to 3.0 percent by mass. The alloy elements can by way of example be a rare earth element such as neodymium. Elements of this type can by way of example migrate to the silver grain boundaries and/or accumulate at the surface of the silver layer, thus becoming oxidized there more readily than the nobler silver and forming a microscopically thin protective layer on the silver grains. The effectiveness of these alloy elements can be further increased by use of palladium, platinum, gold and/or copper for additional alloying. This also inhibits diffusion, and counters coalescence of silver crystallites, in particular at the relatively high temperatures that may arise under operating conditions. This advantageously results in retarded ageing of the reflective layer, i.e. delayed decrease of reflectivity due to passage of time and/or to temperature-related effects.

Palladium can also be alloyed as main alloy element with the silver, the proportion by mass of palladium preferably being in the range 0.5 percent by mass to 3.0 percent by mass of the alloy, and additionally a smaller proportion or at most the same proportion of one of the elements aluminum, gold, platinum, copper, tantalum, chromium, titanium, nickel, cobalt or silicon can be present here as third alloy component.

Silver layers can also be alloyed with molybdenum, and in contrast to the above in comparatively high proportions—in particular up to 70 percent by mass, preferably 5 percent by mass to 30 percent by mass. This likewise results in inhibition of diffusion, and moreover in improved adhesion properties of the silver.

Indium, titanium and/or tin can also be provided as alloy elements for the silver. By way of example, an alloy that appears to be suitable in this connection preferably comprises indium and/or tin and/or also antimony and/or bismuth in the range 0.5 percent by mass to 3.0 percent by mass, where the remainder consists of silver.

A suitable target for producing silver-alloy layers in a sputtering process is also described in EP 3 196 334 A1.

Within this specification, embodiments have been described in a way which enables a clear and concise specification to be written, but it is intended and will be appreciated that embodiments may be variously combined or separated without parting from the invention. For example, it will be appreciated that all preferred features described herein are applicable to all aspects of the invention described herein.

The invention is not restricted to the feature combinations described in the independent claims, but can also be defined via any desired other combination of particular features from the entirety of all of the individual features disclosed. In principle, therefore, practically any individual feature of independent claims 1 and 16 can be omitted or replaced by at least one individual feature disclosed at another point in the application. Claims 1 and 16 are therefore to be understood merely as an example to formulate an invention. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

LIST OF REFERENCE SIGNS

1 Carrier of V
2 Interlayer of V on 1 (side A)
3 Optically active multilayer system of V on 2 (side A)
4, 5 Upper layers of 3 (side A)
6 Undermost layer of 3, reflective layer (side A)
7 Outer layer of V at top of 3 (side A)
8 $Al_2O_3$ layer of V on 1 (side B)
9 Layer of a metal or of a metal alloy (side B)
A Upper side of 1
B Underside of 1
D Wire
$D_1$ Thickness of 1
$D_2$ Thickness of 2
$D_3$ Thickness of 3
$D_4$ Thickness of 4
$D_5$ Thickness of 5
$D_6$ Thickness of 6
$D_7$ Thickness of 7
$D_8$ Thickness of 8

$D_9$ Thickness of 9
DG Total thickness of V
DIE Light-emitting diode, bare-chip embodiment of SMD (FIGS. 2, 4)
F H finger of LF (FIGS. 2, 3)
L Bonding layer between V and PCB
LF Lead frame
LV Light-emitting device with V
M Transparent composition of LV (FIG. 4)
PCB Printed circuit board
Q H crossbar of LF (FIG. 3)
SMD Electronic component (surface-mounted device)
SP Weld point (FIG. 2)
V Composite material
Z Zener diode, embodiment of SMD (FIG. 2)

What is claimed is:

1. A reflective composite material with a carrier consisting of aluminum having a thickness in the range of 0.1 mm to 1.5 mm with, located on a first side of the carrier, an interlayer made of anodically oxidized aluminum oxide having an average surface roughness Ra of less than 0.05 µm, and with, applied on the interlayer, an optically active reflection-boosting multilayer system, wherein the thickness of the interlayer consisting of the anodically oxidized aluminum oxide is in the range of 5 nm to 200 nm, and that a layer of a metal or of a metal alloy has been applied superficially on a second side of the carrier that is opposite to the optically active reflection-boosting multilayer system, where the electrical resistivity at 25° C. of the said metal or metal alloy is at most $1.2 \times 10^{-1}$ Ωmm²/m, where the thickness of the layer applied superficially is in the range of 10 nm to 5.0 µm;
wherein one or more of the layer of metal or of metal alloy superficially applied, a passivating layer located thereon, and a reflective layer of the optically active reflection-boosting multilayer system is a silver alloy layer that comprises, as alloy element(s), one or more of rare earth elements, palladium, platinum, gold, copper, indium, titanium, tin, and molybdenum;
wherein at least one of the following is present:
the layer of metal or of metal alloy superficially applied is a copper layer with a thickness in the range of 0.1 µm to 5.0 µm; or
the layer of metal or of metal alloy superficially applied is a silver layer with a thickness in the range of 10 nm to 500 nm; or
the composite material further comprises an adhesion-promoter layer made of a transition metal, the adhesion-promoter layer being arranged between the carrier consisting of aluminum and the layer of metal or of metal alloy superficially applied.

2. The composite material according to claim 1, wherein the electrical resistivity at 25° C. of the layer of a metal or of a metal alloy superficially applied on the second side of the carrier that is opposite to the optically active reflection-boosting multilayer system is at most $2.7 \times 10^{-2}$ Ωmm²/m.

3. The composite material according to claim 1, wherein the thickness of the interlayer consisting of aluminum oxide is in the range of 10 to 100 nm.

4. The composite material according to claim 1, wherein the composite material further comprises the passivating layer deposited on the layer of a metal or of a metal alloy superficially applied, with a thickness being in the range of 10 nm to 500 nm.

5. The composite material according to claim 4, wherein the silver alloy layer comprises palladium as the alloy element along with another alloy element being present in an amount that is the same or smaller than the amount of palladium; wherein this other alloy element is aluminum, gold, platinum, copper, tantalum, chromium, titanium, nickel, cobalt, or silicon.

6. The composite material according to claim 4, wherein one or more of the layers arranged above the interlayer, the layer of a metal or of a metal alloy superficially applied, and the passivating layer, are sputter layers, CVD layers or PECVD layers, or layers produced by evaporation.

7. The composite material according to claim 1, wherein the purity of the aluminum of the carrier (1) is above 99.0%.

8. The composite material according to claim 1, wherein the thickness of the carrier is 0.1 to 1.5 mm.

9. The composite material according to claim 1, wherein a total light reflectance on a first side of the optical multilayer system is above 97%.

10. The composite material according to claim 1, wherein the composite material further comprises a configuration as lead frame for a surface-mounted device, wherein the shape of the lead frame when viewed from above is that of an H with a crossbar running obliquely between tracks configured from fingers, and where the lead frame has been produced by at least one of a die-cutting process, a bending process, and a laser cutting process.

11. The composite material according to claim 10, wherein the composite material further comprises a configuration as frame device in the form of a circuit board in strip form in which a large number of lead frames have been combined in fields in the form of line elements and of column elements, by way of connectors.

12. The composite material according to claim 1, wherein the composite material further comprises a configuration as a coil with width up to 1600 mm.

13. A light-emitting device comprising a composite material according to claim 1, which forms a lead frame for an electronic component, where the electronic component lies on and is secured to the upper side on the lead frame and is electrically contacted to the lead frame by means of a separate wire, and where a composite comprising the electronic component and the lead frame is cohesively bonded on the underside in an electrically conductive manner to a printed circuit board.

14. The light-emitting device according to claim 13, wherein the lead frame has been connected to the printed circuit board by way of a tin-containing solder layer.

15. The light-emitting device according to claim 13, wherein the electronic component is a light-emitting diode configured as chip.

16. The composite material according to claim 2, wherein the electrical resistivity at 25° C. of the layer of a metal or of a metal alloy superficially applied on the second side of the carrier that is opposite to the optically active reflection-boosting multilayer system is at most $1.8 \times 10^{-2}$ Ωmm²/m.

17. The composite material according to claim 1, wherein the transition metal is titanium, chromium or nickel.

18. The composite material according to claim 1, wherein the thickness of the copper layer is in the range of 0.5 µm to 1.5 µm.

19. The composite material according to claim 1, wherein the thickness of the silver layer is in the range of 50 nm to 250 nm.

20. The composite material according to claim 4, wherein the thickness of the passivating layer is in the range of 50 nm to 250 nm.

21. The composite material according to claim 4, wherein the passivating layer consists of Ag, Ni, Pd, Au, or a combination thereof.

22. The composite material according to claim 8, wherein the thickness of the carrier is 0.2 to 0.8 mm.

23. The composite material according to claim 9, wherein the total light reflectance on the first side of the optical multilayer system is at least 98%.

* * * * *